United States Patent
Takahashi et al.

(10) Patent No.: US 6,384,431 B1
(45) Date of Patent: May 7, 2002

(54) INSULATED GATE BIPOLAR TRANSISTOR

(75) Inventors: Shigeki Takahashi; Takanori Teshima; Naohiko Hirano; Norihito Tokura, all of Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/680,538

(22) Filed: Oct. 6, 2000

(30) Foreign Application Priority Data

Oct. 8, 1999 (JP) .......................................... 11-288249

(51) Int. Cl.[7] .............................................. H01L 29/74
(52) U.S. Cl. ..................................................... 257/147
(58) Field of Search ................................ 257/147, 137, 257/139, 330, 331, 138, 140, 145, 339, 341, 342

(56) References Cited

U.S. PATENT DOCUMENTS

| | | | |
|---|---|---|---|
| 4,972,239 A | | 11/1990 | Mihara |
| 4,990,975 A | * | 2/1991 | Hagino ........................ 257/139 |
| 5,124,772 A | * | 6/1992 | Hideshima et al. .......... 257/139 |
| 5,237,183 A | * | 8/1993 | Fay et al. ..................... 257/139 |
| 5,326,993 A | | 7/1994 | Iwamuro |
| 5,355,003 A | | 10/1994 | Tomomatsu |
| 5,357,135 A | | 10/1994 | Aronowitz et al. |
| 5,719,412 A | | 2/1998 | Okabe et al. |
| 5,723,882 A | | 3/1998 | Okabe et al. |
| 5,751,024 A | * | 5/1998 | Takahashi .................... 257/139 |
| 5,894,139 A | * | 4/1999 | Otsuki et al. ................. 257/139 |
| 5,973,338 A | | 10/1999 | Okabe et al. |
| 6,040,599 A | | 3/2000 | Takahashi |

FOREIGN PATENT DOCUMENTS

| | | |
|---|---|---|
| JP | 59-132671 | 7/1984 |
| JP | 60-224269 | 11/1985 |
| JP | 64-82563 | 3/1989 |
| JP | 64-82564 | 3/1989 |
| JP | 6-268226 | 9/1994 |
| JP | 6-318706 | 11/1994 |
| JP | 10-27905 | 1/1998 |
| JP | 10-189956 | 7/1998 |

OTHER PUBLICATIONS

Baliga, B.J., "Analysis of the Output Conductance of Insulated Gate Transistors", IEEE Electron Device Letters, vol. EDL–7, No. 12, Dec. 1986, pp. 686–688.

Laska, Miller and Niedermeyer, "A 2000 V Non–Punch–through IGBT with High Ruggedness", Solid State Electronics, vol. 35, No. 5, May 1992, pp. 681–685.

* cited by examiner

*Primary Examiner*—Howard Weiss
*Assistant Examiner*—(Vikki) Hoa B. Trinh
(74) *Attorney, Agent, or Firm*—Law Offices of David G. Posz

(57) ABSTRACT

Insulated gate bipolar transistors which can restrain causing surge voltage due to an inductance component while an L-load is turned off and can improve a negative characteristic of a sustain voltage during breakdown. An insulated gate bipolar transistor (IGBT) is provided with: a $p^+$-type semiconductor substrate; an $n^+$-type buffer layer having high impurity concentration; an n-type intermediate layer; and an $n^-$-type base layer having low impurity concentration. A p-type well layer and an $n^+$-type emitter layer having high impurity concentration are formed in the $n^-$-type base layer. The n-type intermediate layer has an intermediate impurity concentration between an impurity concentration of the $n^+$-type buffer layer and that of the $n^-$-type base layer. Thickness of the intermediate layer is determined so that the depletion layer does not reach the $n^+$-type buffer layer even when the switching operation of the L-load is turned off. As a result, it can restrain causing surge voltage and can improve a negative characteristic of a sustain voltage.

5 Claims, 8 Drawing Sheets

DEPTH FROM EMITTER SURFACE (μm)

DEPTH FROM EMITTER SURFACE (μm)

US 6,384,431 B1

INSULATED GATE BIPOLAR TRANSISTOR

CROSS REFERENCE TO RELATED APPLICATION

This application is based upon Japanese Patent Application No. Hei. 11-288249 filed on Oct. 8, 1999, the contents of which are incorporated herein by reference.

BACKGROUND OF THE INVENTION

1. Field of the Invention

This invention relates to insulated gate bipolar transistors, and particular to an insulated gate bipolar transistor having a buffer layer between a collector layer and a base layer in a substrate.

2. Related Art

In a case of power devices used for inverter circuits in a driving circuit which switches a motor or the like, surge voltage may be applied due to an inductance component when the power is turned off. In this case, the power device may be damaged. When an insulated gate bipolar transistor (IGBT) is used as the power device, since sustain characteristic during breakdown indicates negative characteristic, current may be locally concentrated during the breakdown, and therefore the inherent characteristic of the IGBT may facilitate causing the damage. Since the surge voltage caused during the turning off of the IGBT may causing the damage, some countermeasures have been taken.

For example, JP A 6-268226 discloses one IGBT. As shown in FIG. 11, an n-type buffer layer 2, an n-type intermediate layer 3, and an n-type base layer 4 are formed in this order on a p-type semiconductor substrate 1. A p-type well layer 5 and a high concentration n-type emitter layer 6 are sequentially formed in the n-type base layer 4. Furthermore, a gate insulating film 7 and each electrode are formed. The n-type intermediate layer 3 has an impurity concentration between that of the buffer layer 2 and that of the n-type base layer 4 each of which sandwiches the n-type buffer layer 2. Distribution of the impurity concentration along a depth direction from the emitter surface is shown in FIG. 12B.

According to this structure, while an L-load is turned off, when a depletion region spreading in the n-type base layer 4 reaches the n-type intermediate layer 3, the spread of the depletion region is restricted. Since the impurity concentration of the n-type intermediate layer 3 is lower than that of the n-type buffer layer 2, it can restrain abrupt decreasing of current. Then, the surge voltage can be reduced. FIG. 12A shows the distribution of the electric field E from the emitter surface, when the breakdown starts according to the related art shown in FIG. 11.

However, in the case where the n-type intermediate layer 3 is provided in this way, the depletion layer may reach the n-type buffer layer 2 from the n-type base layer 4 through the n-type intermediate layer 3 during turning off by the L-load. In such a situation, even if the n-type intermediate layer 3 is formed, a boundary of the depletion layer has reached the n-type buffer layer 2 at the breakdown timing, the negative characteristic of the sustain characteristic increase, and therefore a breakdown with stand voltage may lower.

SUMMARY OF THE INVENTION

This invention has been conceived in view of the background thus far described and its first object is to provide insulated gate bipolar transistors which can restrain causing surge voltage due to an inductance component while an L-load is turned off.

Its second object is to provide insulated gate bipolar transistors which can improve a negative characteristic of a sustain voltage during breakdown.

Its third object is to provide insulated gate bipolar transistors which can restrain causing surge voltage due to an inductance component while an L-load is turned off and can improve a negative characteristic of a sustain voltage during breakdown.

According to the present invention, the third semiconductor layer has a predetermined impurity concentration and a predetermined thickness so that a depletion region expanding from a side of the fourth semiconductor layer stops before the depletion region reaches the second semiconductor layer, at a time of a breakdown. In this structure, a space charge density as a result of depletion is lowered. When breakdown current increases, space charges which are cancelled by carriers injected from the first semiconductor layer decrease. Thus a sustain characteristic can be improved.

BRIEF DESCRIPTION OF THE DRAWINGS

These and another objects, features and characteristics of the present invention will be appreciated from a study of the following detailed description, the appended claims, and drawings, all of which form parts of this application. In the drawings, same portions or corresponding portions are put the same numerals each other to eliminate redundant explanation. In the drawings:

DESCRIPTION OF THE PREFERRED EMBODIMENTS

First Embodiment

A first embodiment of the present invention will be explained with reference to FIGS. 1 to 9.

Figure 1:
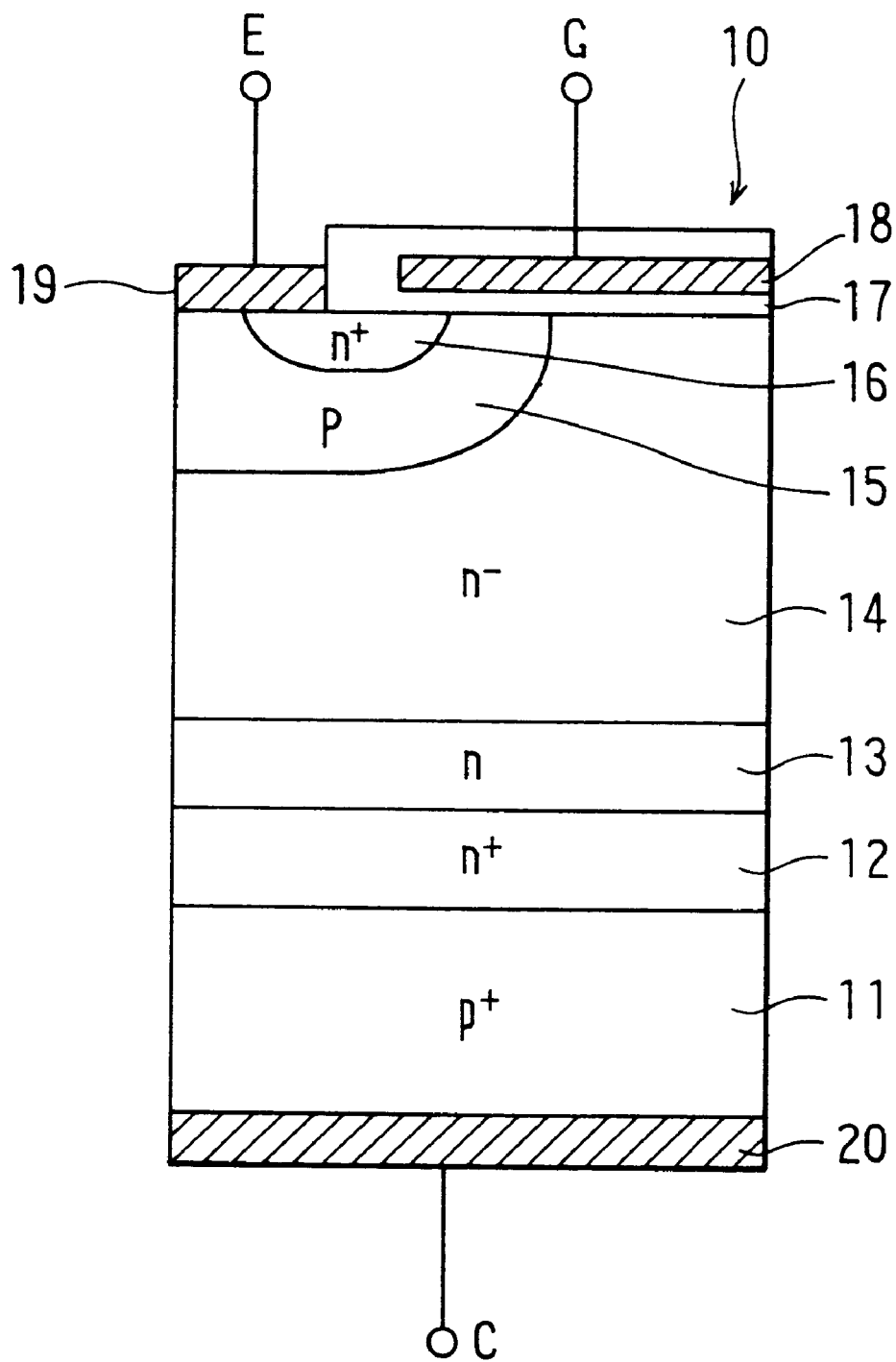
FIG. 1 is a schematic sectional view of a semiconductor device of a first embodiment according to the present invention.

As shown in FIG. 1, an insulated gate bipolar transistor (IGBT) 10 is provided with: a p$^+$-type semiconductor substrate 11 as a first semiconductor layer (to become a collector layer) made of silicon and having high impurity concentration; an n$^+$-type buffer layer 12 as a second semiconductor layer having high impurity concentration and being formed on the semiconductor substrate 11; an n-type intermediate layer 13 as a third semiconductor layer formed on the n$^+$-type buffer layer 12; and an n$^-$-type base layer 14 as a fourth semiconductor layer having low impurity concentration and being formed on the n-type intermediate layer 13. A p-type well layer 15 as a fifth semiconductor layer; a n$^+$-type emitter layer 16 as a sixth semiconductor layer having high impurity concentration are formed in this order in the n$^-$-type base layer 14. In this case, the n-type intermediate layer 13 has an intermediate impurity concentration between an impurity concentration of the n$^+$-type buffer layer 12 and that of the n$^-$-type base layer 14 which sandwich the n-type intermediate layer 13 with the n$^+$-type buffer layer 12.

An insulating film 17 for gate electrode is formed on a surface portion of the p-type well layer 15 at a portion where a channel is to be formed. A gate electrode 18 is formed on an upper surface of the insulating film 17. This gate electrode 18 can be electrically connected externally via a take-out electrode (not shown). One end of the take-out electrode is defined as a gate terminal G. An emitter electrode 19 is formed on a surface portion of the n$^+$-type emitter layer 16 so as to short-circuit with p-type well layer 15. Furthermore, a collector electrode 20 is formed on a back surface of the p$^+$-type semiconductor substrate 11.

Figure 2A:
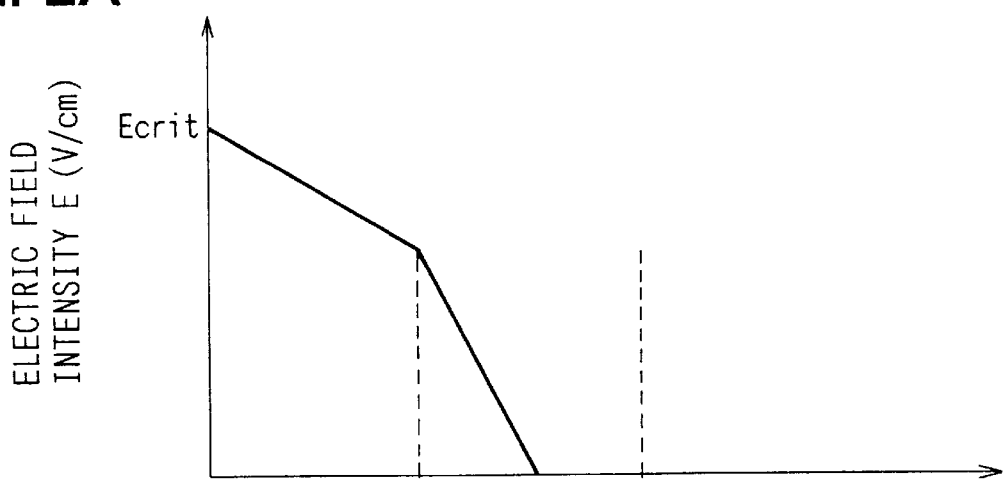
FIG. 2A is a diagram illustrating a distribution of electric field intensity with respect to a depth.
Figure 2B:
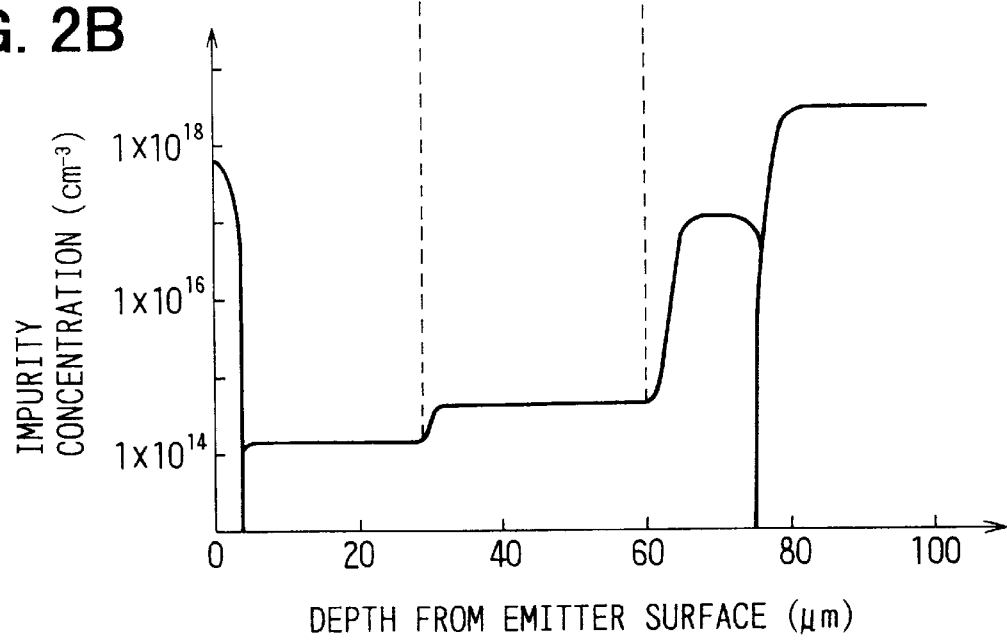
FIG. 2B is a diagram illustrating a distribution of impurity concentration with respect to a depth.

In the above structure, the impurity concentration and the thickness of each semiconductor layer is determined based on the following basis. As a result, distribution condition of the impurity concentration along a depth direction is determined as shown in FIG. 2 so that the following condition is satisfied. In detail, when the impurity concentration of the n-type intermediate layer 13 as the third semiconductor layer is $C_3$, the depth in the n-type intermediate layer 13 is $X_3$, the impurity concentration of the n$^-$-type base layer 14 as the fourth semiconductor layer is $C_4$, and the depth in the n$^-$-type base layer 14 is $X_4$, each of them is determined so as to satisfy the following equation (1) with respect to a (avalanche breakdown) critical electric field intensity $E_{crit}$ of the silicon (Si). Here, $\epsilon s$ is a relative dielectric constant and q is unit charge.

$$qC_4X_4/\epsilon s \leq E_{crit} \leq q(C_3X_3+C_4X_4)/\epsilon s \tag{1}$$

For example, the impurity concentration and the thickness which satisfy the equation (1) can be determined as follows.

| | Impurity concentration | Thickness |
|---|---|---|
| n$^-$-type base layer 14 | $1 \times 10^{14}$ cm$^{-3}$ | 30 μm |
| n-type intermediate layer 13 | $4 \times 10^{14}$ cm$^{-3}$ | 30 μm |
| N$^+$-type buffer layer 12 | $1 \times 10^{17}$ cm$^{-3}$ | 10 μm |

According to the above structure, it can restrain an increase of dV/dt during turning off by switching operation of L-load. As a result, it can improve the withstand voltage of the breakdown.

Here, in general, the $E_{crit}$ varies based on the impurity concentration of the base layer 14. Therefore, in this embodiment, the (avalanche breakdown) critical electric field intensity $E_{crit}$ is determined at the base layer 14 located near a boundary between the base layer 14 and the well layer 15.

In other words, an impurity concentration NB of a particular region defined in the base layer 14 between the well layer 15 and the intermediate layer 13, a thickness XB of the particular region of the base layer 14, an impurity concentration NM of a particular region defined in the intermediate layer 13 between the base layer 14 and the buffer layer 12, and a thickness XM of the particular region of the intermediate layer 13 are respectively determined so that the following equation (2) is satisfied with respect to an avalanche breakdown critical electric field intensity $E_{crit}$ at the particular region of the base layer 14 located near a boundary between the base layer 14 and the well layer 15.

$$q \cdot NB \cdot XB/\epsilon s \leq E_{crit} \leq q(NB \cdot XB+NM \cdot XMB)/\epsilon s \tag{2}$$

Here, $\epsilon s$ is a relative dielectric constant of a material making up of the base layer and the intermediate layer, and q is unit charge.

According to an investigation, when the impurity concentration of the based layer is approximately $1 \times 10^{14}$ cm$^{-3}$ or less, it is found that the $E_{crit}$ becomes approximately $2 \times 10^5$ V/cm and it changes a little even if the impurity concentration varies.

Here, since this embodiment has been explained with using the vertical DMOS structure IGBT, the thickness of the base layer under the well layer is determined as the thickness sandwiched between the well layer 15 and the intermediate layer 13. However, in a case of the lateral DMOS structure IGBT, the thickness of the base layer is determined as a length in lateral direction between the well layer 15 and the intermediate layer 13.

Figure 3:
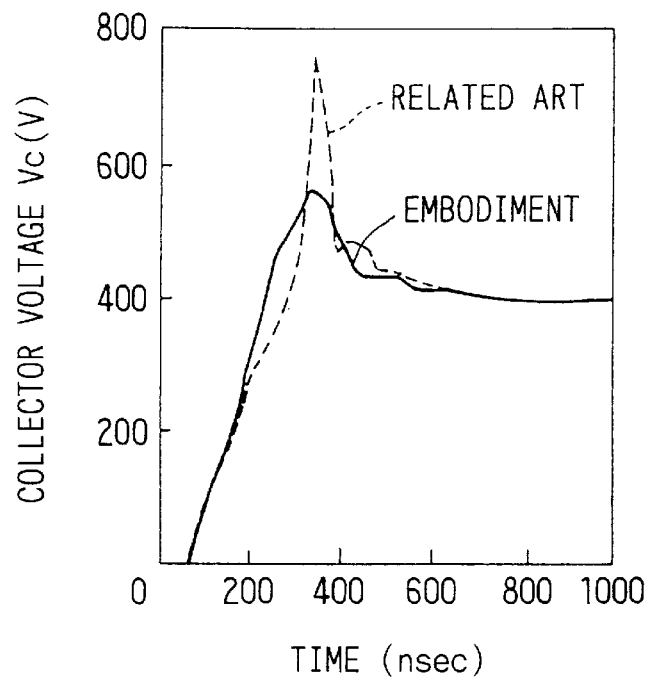
FIG. 3 is a diagram illustrating a simulation result of a surge voltage wave form during turning off by switching with an L-load.

FIG. 3 is a diagram illustrating simulation results of surge voltage waveforms during turning off by switching with the L-load. Solid line indicates the result of this embodiment, and dotted line indicates the result of the related art. According to these results, this embodiment can restrain the increase of the collector voltage Vc and can restrain the increase of the dV/dt, compared to the related art.

Figure 4:
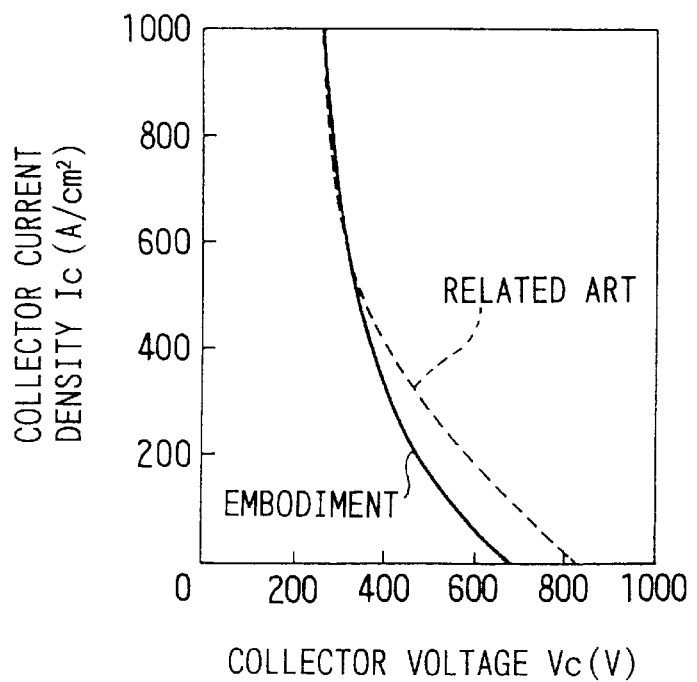
FIG. 4 is a diagram illustrating a simulation result of a sustain characteristic.

FIG. 4 is a diagram illustrating simulation results of a sustain characteristic. According to these results, this embodiment can also restrain the sustain voltage, and can improve its withstand voltage.

The above improvement can be achieved in another structure having the following parameters.

|  | Impurity concentration | Thickness |
| --- | --- | --- |
| n⁻-type base layer 14 | $8 \times 10^{13}$ cm⁻³ | 30 μm |
| n-type intermediate layer 13 | $8 \times 10^{14}$ cm⁻³ | 20 μm |
| n⁺-type buffer layer 12 | $5 \times 10^{17}$ cm⁻³ | 10 μm |

The above parameters satisfy the equation (2) as follows.

$$1.602 \times 10^{-19} \cdot 8 \times 10 \cdot\!-\!\cdot 40 \times 10^{-4}/(11.9 \cdot 8.854 \times 10^{-14}) = 4.865 \times 10^{4} (V/cm)$$
$$1.602 \times 10^{-19} \cdot (8 \times 10^{13} \cdot 40 \times 10^{-4} + 8 \times 10^{14} \cdot 20 \times 10^{-4})/(11.9 \cdot 8.854 \times 10^{-14}) = 2.92 \times 10^{5} (V/cm)$$

Here, a punch-through type IGBT is generally formed so that an epitaxial layer to be the n⁻-type base layer is thinner to reduce an ON-resistance, and a lowering of the withstand voltage as a result of using the n⁻-type base layer is prevented by providing the n⁺-type buffer layer. However, in such an IGBT, high surge voltage may occur during switching operation of the L-load. When this surge voltage is more than the withstand voltage of the element, the element may be damaged.

In order to solve this inconvenience, occurrence mechanism of the surge during the switching of the L-load is analyzed by using device simulation. As a result, it is found that the surge voltage occurs in association with relationship between depletion region position, the impurity concentration, and lifetime of carrier at non-depletion region. The IGBT which can restrain the occurrence of the surge voltage during L-load switching is considered based on the simulation result.

Figure 5:
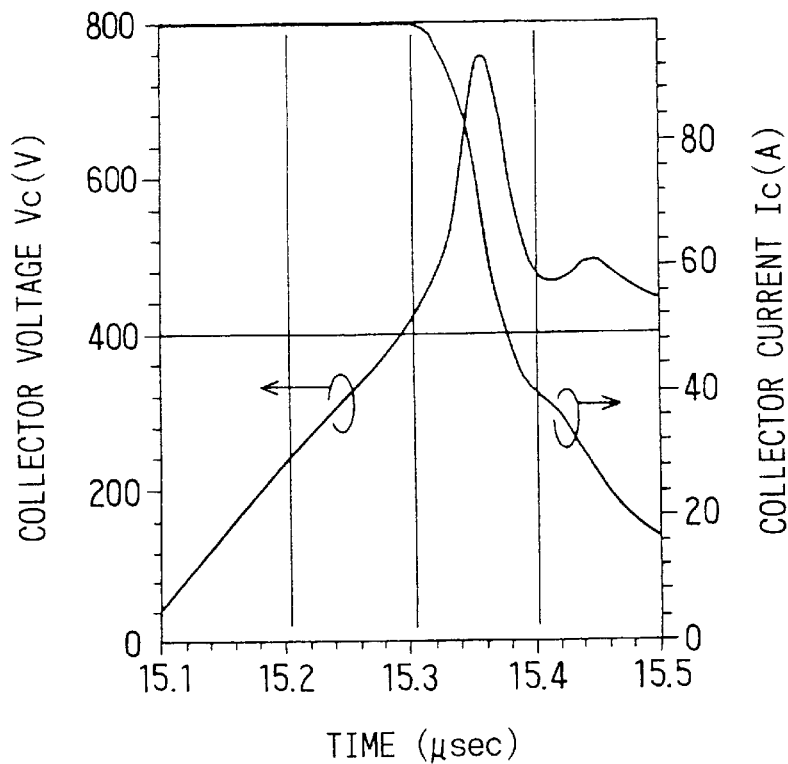
FIG. 5 is a diagram illustrating a simulation result of a collector voltage and a corrector current when the surge voltage occurs.
Figure 6:
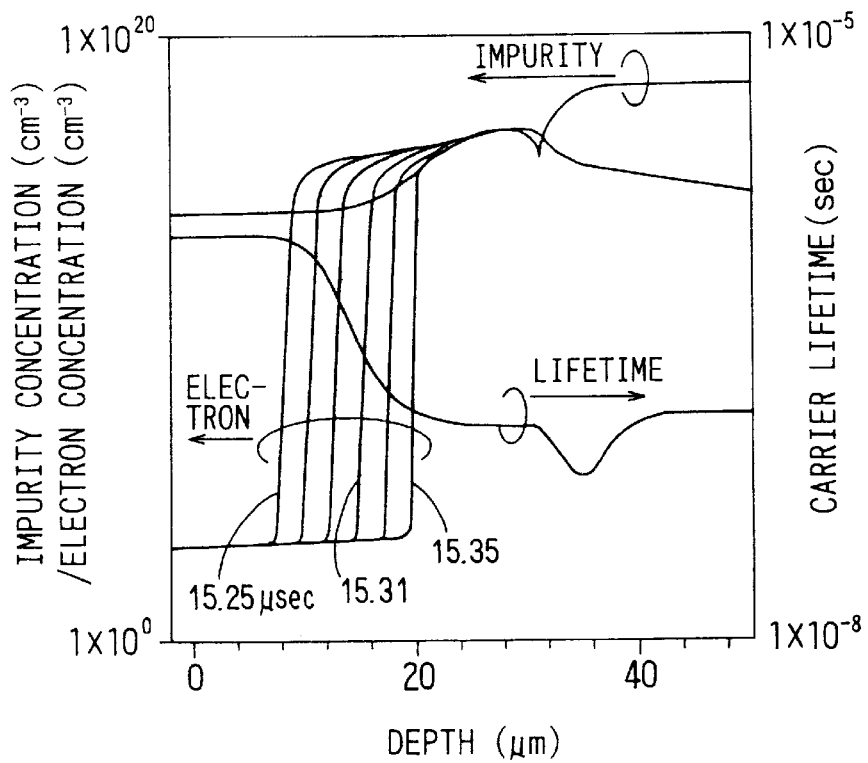
FIG. 6 is a diagram illustrating a simulation result of distributions of the impurity concentration and that of electron concentration with respect to the depth when the surge voltage occurs.
Figure 7:
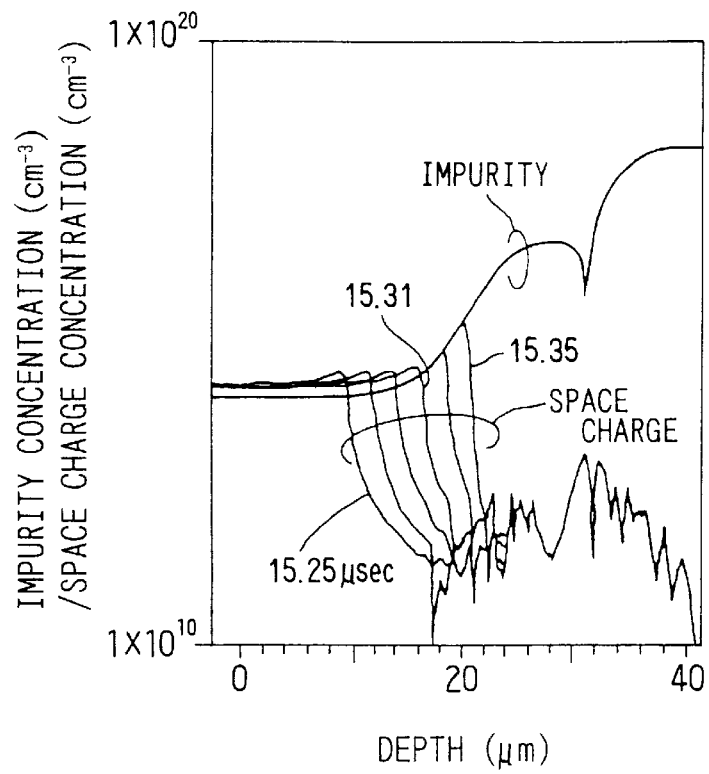
FIG. 7 is a diagram illustrating a simulation result of distributions of space charge with respect to the depth when the surge voltage occurs.
Figure 8:
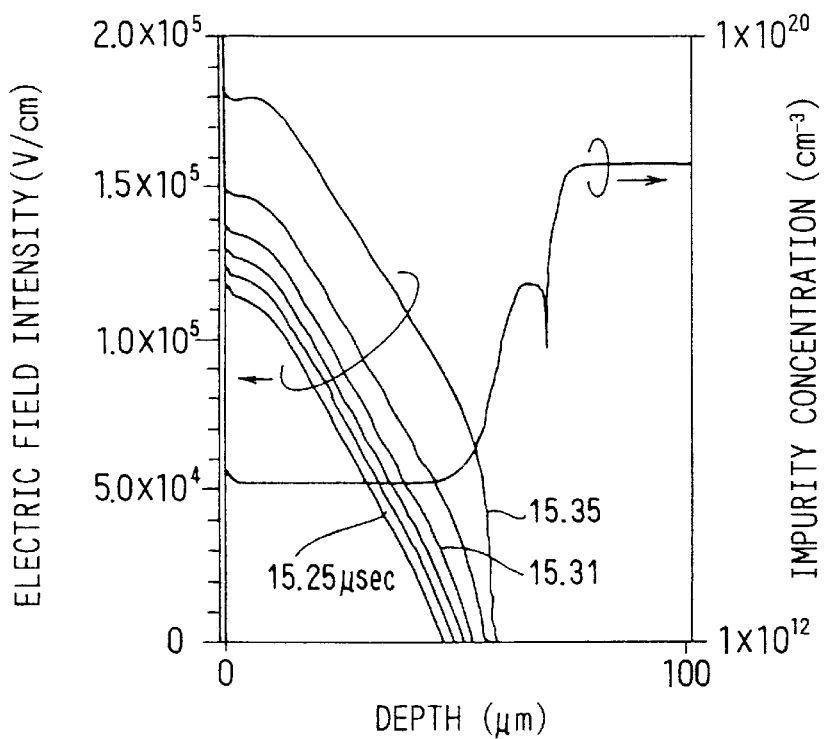
FIG. 8 is a diagram illustrating a simulation result of distributions of electric field intensity with respect to the depth when the surge voltage occurs.

FIG. 5 shows the collector voltage Vc and the collector current Ic with respect to time, when the surge voltage occurs. Furthermore, FIG. 6 shows the impurity concentration, electron concentration as the carrier concentration, and the lifetime of the electron with respect to the depth. From FIG. 6, it is found that a boundary portion of the depletion layer is about to reach the buffer layer when the surge voltage is about to occur. The distributions of space charge when the surge voltage is about to occur is shown in FIG. 7. In detail, the electric field intensity increases as shown in FIG. 8 as the space charge abruptly increases, and the surge voltage occurs as a result of this increasing.

Therefore, in such a case, a structure, in which the depletion layer does not reach the n⁺-type buffer layer even when the maximum voltage is applied to the IGBT, is contemplated. There are four methods to realize the above structure.

(1) Form the n-type epitaxial layer as the n⁻-type base layer thicker.

(2) Decide the impurity concentration of the n⁻-type base layer higher.

(3) Decide the impurity concentration of the n⁻-type base layer to have impurity concentration contribution, so that the depletion region does not reach the n⁺-type buffer layer.

(4) Decide the lifetime longer at the region at which is not depleted when the maximum voltage is applied, so that generation speed of the space charge is lowered by lowering a spread speed of the depletion layer (to make the peak as deep as possible in the case of local lifetime).

Therefore, this embodiment selects the method (3). Actually, the n-type intermediate layer 13 having the intermediate impurity concentration between the impurity concentration of the n⁺-type buffer layer 12 and that of the n⁻-type base layer 14 is provided.

According to this embodiment, since the n-type intermediate layer 13 is formed so as to have the structure the having impurity concentration and the thickness satisfying the equation (1), it can restrain causing surge voltage due to an inductance component while an L-load is being turned off and can improve a negative characteristic of a sustain voltage during breakdown.

Second Embodiment

Figure 9A:
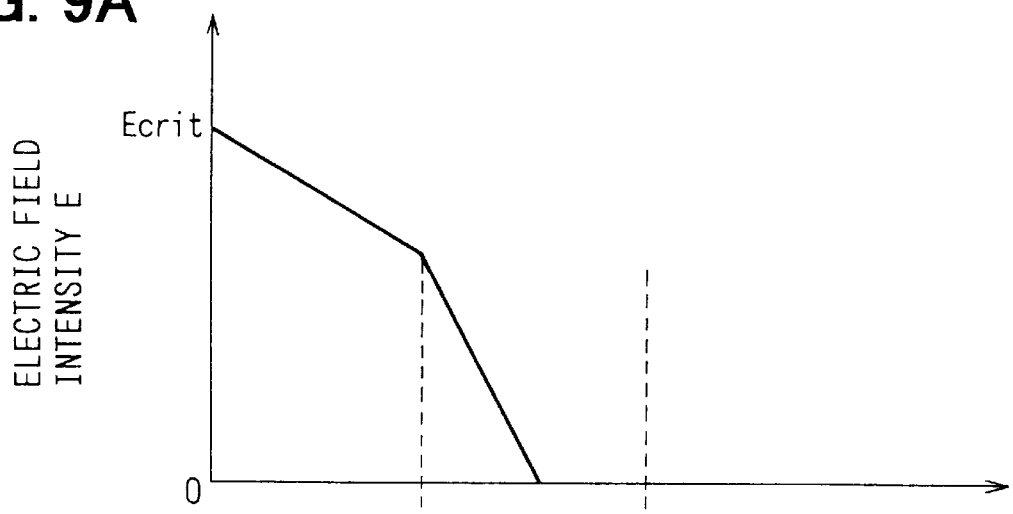
FIG. 9A is a diagram illustrating a distribution of electric field intensity with respect to a depth of a second embodiment.
Figure 9B:
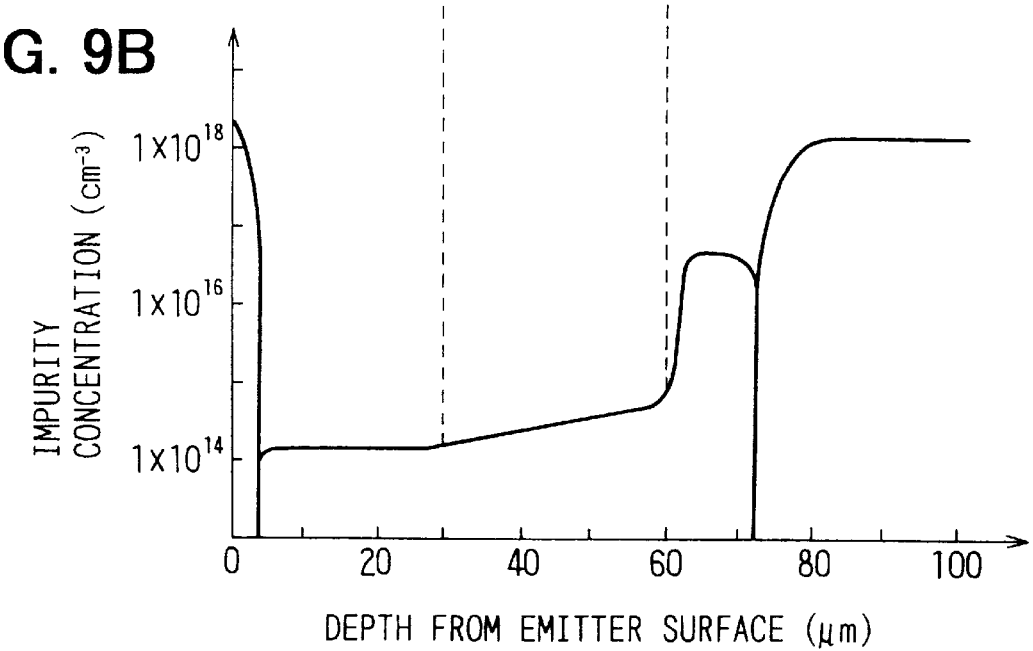
FIG. 9B is a diagram illustrating a distribution of impurity concentration with respect to a depth of the second embodiment.
Figure 10:
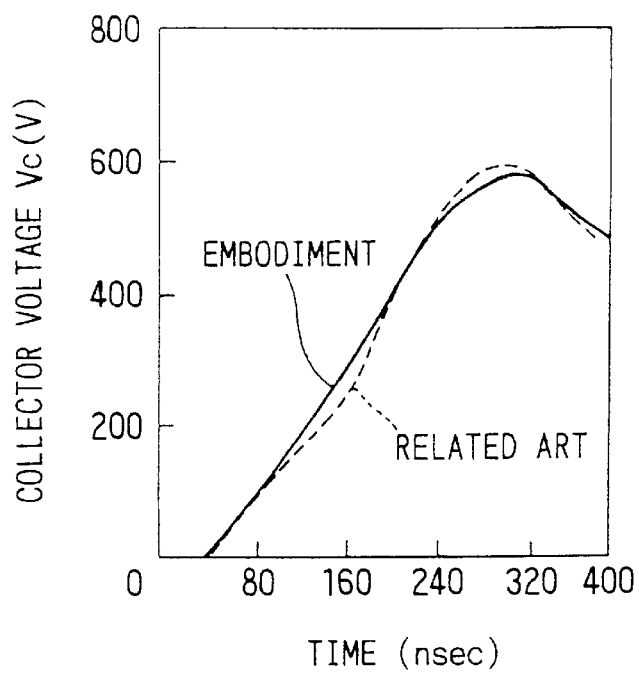
FIG. 10 is a diagram illustrating a simulation result of a surge voltage waveform during turning off by switching with an L-load of the second embodiment.
Figure 11:
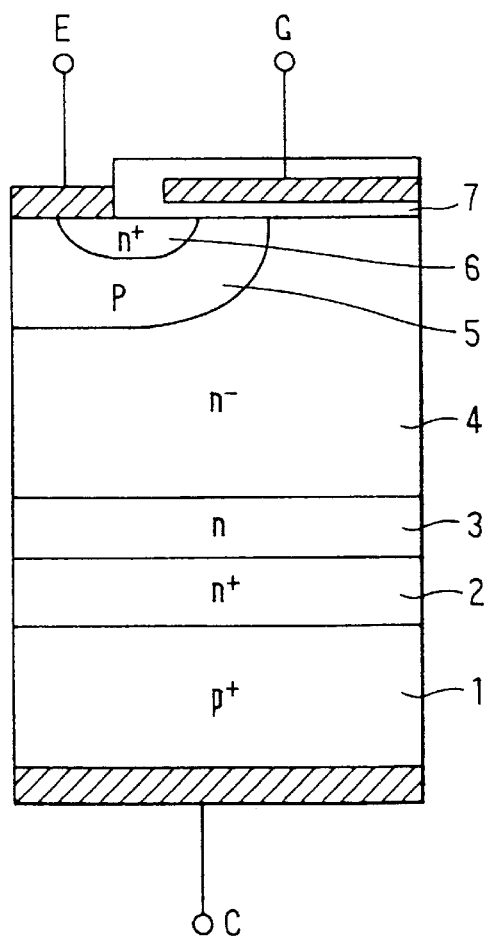
FIG. 11 is a schematic sectional view of a semiconductor device according to a related art.
Figure 12A:
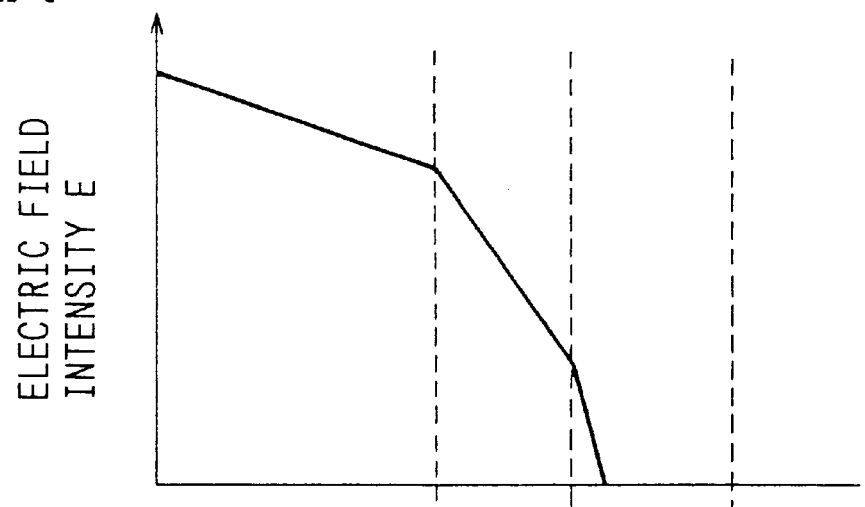
FIG. 12A is a diagram illustrating a distribution of electric field intensity with respect to a depth of the related art.
Figure 12B:
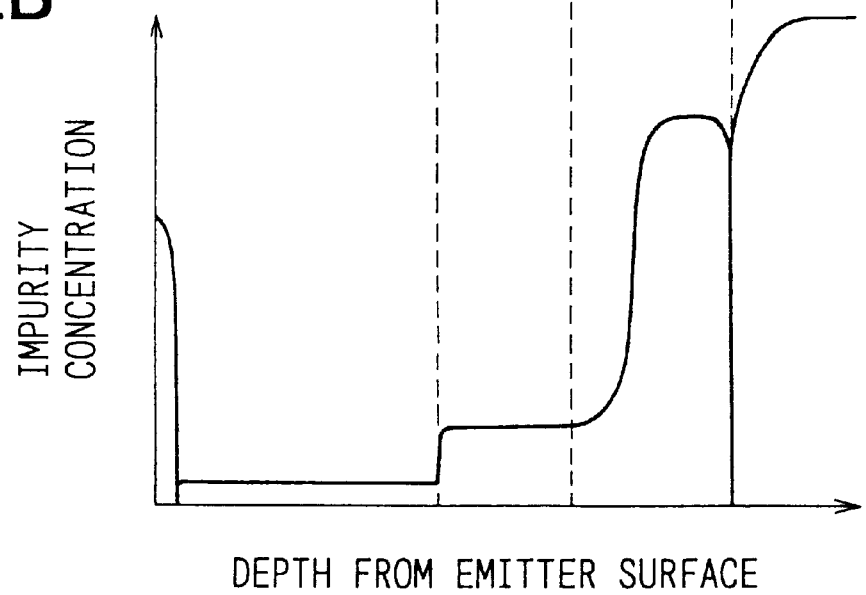
FIG. 12B is a diagram illustrating a distribution of impurity concentration with respect to a depth of the related art.

FIGS. 9 and 10 show a second embodiment of the present invention. The second embodiment is different from the first embodiment in the distribution of the impurity concentration of the n-type intermediate layer 13. As shown in FIGS. 9A and 9B, the impurity concentration has a gradient. In detail, the impurity concentration of the n-type intermediate layer 13 as the third semiconductor layer and that of the n⁻-type base layer 14 as the fourth semiconductor layer is continuously changed. The gradient of the impurity concentration is set to $1 \times 10^{14}$ cm⁻³ ($1 \times 10^{18}$ cm⁻⁴) or less.

This structure can restrain the dV/dt. FIG. 10 shows a characteristic of dV/dt which is calculated by a simulation. This structure can reduce the maximum value of dV/dt by 20% or more compared to that of the related art.

The present invention is not limited to the above embodiments, and can be modified or expanded as follow. That is, it can be applied to p-channel type IGBT in addition to the n-channel type IGBT.

What is claimed is:

1. An insulated gate bipolar transistor comprising:

a first semiconductor layer having a first conductivity type;

a second semiconductor layer formed on the first semiconductor layer, and having a second conductivity type;

a third semiconductor layer formed on the second semiconductor layer, and having the second conductivity type;

a fourth semiconductor layer formed on the third semiconductor layer, and having the second conductivity type;

a fifth semiconductor layer formed in a surface side of the fourth semiconductor layer, and having the first conductivity type;

a sixth semiconductor layer formed in a surface side of the fifth semiconductor layer, and having the second conductivity type; and an insulated gate structure for defining a channel region at the surface side of the fifth semiconductor layer between the fourth semiconductor layer and the sixth semiconductor layer, wherein a gradient of impurity concentration at a boundary region between the third semiconductor layer and the fourth semiconductor layer is set to $1 \times 10^{14}$ cm⁻³/μm ($= 1 \times 10^{18}$ cm⁻⁴) or less, and wherein an impurity concentration of the third semiconductor layer is lower than an impurity concentration of the second semiconductor layer, and the impurity concentration of the third semiconductor layer is higher than an impurity concentration of the fourth semiconductor layer.

2. An insulated gate bipolar transistor comprising:

a collector layer having a first conductivity type;

a base layer formed above the collector layer, and having a second conductivity type;

a well layer formed on the base layer, and having the first conductivity type;

an emitter layer formed on the well layer, and having the second conductivity type; and a gate structure for defining a channel region at the surface side of the well layer between the emitter layer and the base layer, wherein the insulated gate bipolar transistor further comprises:

a buffer layer formed between the collector and the base layer, the buffer layer having the second conductivity type and a higher impurity concentration than the base layer; and an intermediate layer formed between the buffer layer and the base layer, the intermediate layer having the second conductivity type and a lower impurity concentration than the buffer layer, wherein an impurity concentration NB of a first region defined in the base layer between the well layer and the intermediate layer, a thickness XB of the first region, an impurity concentration NM of a second region defined in the intermediate layer between the base layer and the buffer layer, and a thickness XM of the second region are respectively determined so that the following equation is satisfied with respect to an avalanche breakdown critical electric field intensity $E_{crit}$ at the first region of the base layer located near a boundary between the base layer and the well layer, $$q \cdot NB \cdot XB / \epsilon s \leq E_{crit} \leq q(NB \cdot XB + NM \cdot XM)/\epsilon s$$

and $\epsilon s$ is a relative dielectric constant of a material making up the base layer and the intermediate layer, and q is unit charge, wherein the impurity concentration of the intermediate layer is lower than the impurity concentration of the buffer layer, and the impurity concentration of the intermediate layer is higher than an impurity concentration of the base layer.

3. An insulated gate bipolar transistor comprising:

an intermediate layer of a conductivity type with a first thickness and a first doping concentration;

a base layer of the conductivity type of the intermediate layer with a second thickness and a second doping concentration and in electronic communication with the intermediate layer;

a well layer of a conductivity type different than the intermediate layer formed on the base layer;

an emitter layer of the conductivity type of the intermediate layer formed on the well region;

a buffer layer of the conductivity type of the intermediate layer disposed below the intermediate layer;

a collector layer of a conductivity type different than the intermediate layer and disposed below the buffer layer; and wherein the first thickness and the first doping concentration of the intermediate layer and the second thickness and the second doping concentration of the base layer are set so that a depletion layer is prevented from reaching the buffer layer when a maximum voltage is applied.

4. The insulated gate transistor of claim 3, wherein the first thickness and the first doping concentration of the intermediate layer and the second thickness and the second doping concentration of the base layer are set so that an electric field intensity within the base layer is less than a critical electric field intensity for avalanche breakdown and so that an electric field intensity defined by the base layer and the intermediate layer is greater than the critical electric field intensity for avalanche breakdown.

5. The insulated gate transistor of claim 3, wherein an excess carrier lifetime of a carrier is longer within layers not reached by the depletion layer when the maximum voltage is applied.

* * * * *